United States Patent [19]

Perna et al.

[11] 4,213,013
[45] Jul. 15, 1980

[54] TELEPHONE NETWORK/SUBSCRIBER INTERFACE DEVICE

[75] Inventors: Jiulio E. Perna, Naperville; Gerhard R. Mache, Hoffman Estates, both of Ill.

[73] Assignee: Bunker Ramo Corporation, Oak Brook, Ill.

[21] Appl. No.: 879,021

[22] Filed: Feb. 17, 1978

[51] Int. Cl.² .............................................. H04Q 1/02
[52] U.S. Cl. .................. 179/98; 179/1 PC; 179/175; 361/428
[58] Field of Search ................. 339/17 R, 18 R, 18 B, 339/18 C, 65, 150 B, 150 T, 198 R, 198 J, 198 K; 179/1 PC, 91 R, 91 A, 98, 175, 175.1 R; 174/59, 60; 361/352, 358, 360, 361, 363, 426, 428, 429

[56] References Cited

U.S. PATENT DOCUMENTS

| | | | |
|---|---|---|---|
| 3,660,802 | 5/1972 | Staudt | 174/60 |
| 3,704,347 | 11/1972 | Brown | 179/91 R |
| 3,869,582 | 3/1975 | Humphrey et al. | 179/98 |
| 3,919,495 | 11/1975 | Berglund et al. | 361/428 |
| 3,944,758 | 3/1976 | Carney et al. | 179/175 |
| 3,955,868 | 5/1976 | Kindermann et al. | 339/18 B |
| 3,970,802 | 7/1976 | Nijman | 179/98 |
| 4,037,910 | 7/1977 | Paluch | 179/98 |
| 4,115,665 | 9/1978 | Giacoppo et al. | 179/98 |

FOREIGN PATENT DOCUMENTS 2526927 1/1976 Fed. Rep. of Germany ............. 179/98

OTHER PUBLICATIONS

"System 66 Connectorized Back Panels and 66 Blocks", Technical Brochure; Amphenol Connector Systems of Bunker Ramo Corp.; Nov. 1976.
"Interconnections for Telephone Systems"; Technical Brochure TP-1; Amphenol Division of Bunker Ramo Corp.; prior to 1977.
"Modular Intermediate Termination"; Technical Brochure; Amphenol Division of Bunker Ramo Corp., May 1975.
Amphenol Connector Systems Advertisement; Telephony Magazine; Mar. 28, 1977; p. 7.

*Primary Examiner*—James W. Moffitt
*Assistant Examiner*—Randall P. Myers
*Attorney, Agent, or Firm*—F. M. Arbuckle; John R. Hoffman

[57] ABSTRACT

A modular interface device permits selective interconnection between telephone company network trunk lines and subscriber telephone lines. The device includes a housing having a removable protective cover and a first connector component having a plurality of contact elements aligned in at least two rows. The network trunk line conductors are electrically engageable with the contact elements so that each row of contact elements is associated with one tip or ring conductor, for instance. A second connector component is also provided having a plurality of second contact elements aligned in at least two rows. The subscriber telephone line conductors are electrically engageable with the second contact elements in such a manner that each row of second contact elements is associated with one of the subscriber line conductors. An array of contact members is disposed within the housing with the contact members aligned in a plurality of rows, each row of contact members being electrically engaged with and corresponding to a single row of contact elements in one of the connector components. The rows of contact members are arranged such that patchcord connector means may selectively interconnect contact members from each row associated with the network trunk lines with contact members from the rows associated with the subscriber telephone lines. Finally, integral testing means are provided for engaging selected contact members to independently test the electrical circuit of each network trunk line conductor and each subscriber telephone line conductor.

16 Claims, 7 Drawing Figures

TELEPHONE NETWORK/SUBSCRIBER INTERFACE DEVICE

BACKGROUND OF THE INVENTION

This invention relates generally to telephone interconnection devices and more particularly to modular interface devices for use in telephone interchange systems. Specifically, the present invention relates to an orange field interface device for selectively interconnecting network telephone trunk lines with various subscriber owned and operated telephone lines and equipment.

Telephone interconnection and interchange systems include a wide variety of interface devices and arrangements for connecting network telephone trunk lines originating from a telephone company central office to individual customer or subscriber telephone keysets. Within such telephone interconnection and distribution systems located at a subscriber site, such as an office building, devices and equipment utilized for performing cross connections from central office network lines to other subscriber interchange equipment have traditionally been designated as green field devices. In addition, red field equipment has traditionally been utilized for performing key equipment connections, while yellow field devices are generally utilized to add special equipment and line functions, such as bells, lights, and the like, to the subscriber telephone lines. Furthermore, blue field devices and equipment have traditionally been designated for receiving connections from the green, red and yellow field devices and performing cross connections to customer keyset installations.

In the past, cables carrying network trunk lines from a telephone company central office have generally been introduced into an individual office building and connected to green field equipment and devices. Such devices are usually located in the basement of a building and are traditionally owned and maintained by one of the various telephone companies. Prior to the availability of privately owned subscriber telephone equipment not affiliated with the various telephone companies, it was generally unnecessary to determine and define the responsibility for maintenance and repair of specific devices and equipment within a particular telephone interchange system. Now, of course, private ownership of the devices and equipment of an entire telephone interconnection system, or at least portions thereof, located at a subscriber site has become quite common. Therefore, a need has arisen for an interface device which serves as an initial junction terminal between telephone company operated network trunk lines and the privately owned subscriber telephone interchange system. Such an interface device should permit simple and rapid conductor connections and easy differentiation between telephone company and subscriber owned lines and equipment. The device should also provide the capability of simple re-arrangement of connections between various subscriber telephone lines and available network trunk lines, and an ability to test the telephone lines to quickly determine whether malfunctions occurring there are located in the telephone company owned and operated equipment and trunk lines or within the subscriber owned and operated telephone interchange system.

Heretofore, network trunk line conductors have generally been hard wired onto quick connect blocks incorporated within the green field equipment. Such arrangements do not permit rapid and easy changing of conductor connections nor function to establish a separate and easily distinguishable juncture point or demarcation between the maintenance and repair responsibilities of the network trunk line supplier and the in-house or subscriber telephone interface equipment supplier. Thus, rapid and simple detection and differentiation between network supplier equipment and in-house subscriber equipment for testing and repair purposes has not been previously available.

SUMMARY OF THE INVENTION

The present invention, therefore, is directed to a modular interface device for selectively interconnecting network telephone trunk lines to subscriber telephone lines in a manner that overcomes the above-described deficiencies and problems of prior devices and arrangements used for such purposes in telephone interchange systems.

It is one object of the present invention to provide a modular interface device designated as an orange field device for the express purpose of interconnecting network telephone trunk lines with various selected subscriber telephone lines which lead to additional subscriber telephone interchange and keyset equipment.

Another object of the present invention is to provide an orange field interface device of the above type wherein the network trunk lines and the subscriber telephone lines are rapidly and simply distinguished.

It is a further object of the present invention to provide an orange field interface device whereby interconnections between subscriber telephone lines and network trunk lines may be rapidly and simply re-arranged while preventing transposition of conductor circuit functions or short-circuiting.

Yet another object of the present invention is to provide an orange field interface device whereby network trunk lines and subscriber telephone lines may be easily and readily tested to determine the location of malfunctions in the telephone interconnection system without affecting the operation of other telephone lines.

Accordingly, the modular interface device of the present invention includes a housing having a base member, a plurality of sidewalls, and a removable protective cover. A first multiple contact connector component is mounted within the housing and includes a plurality of first contact elements preferably aligned in two rows. The first contact elements are adapted for electrical engagement with the network trunk line conductors in a manner such that each row of contact elements is associated with a single circuit characteristic typically being termed tip or ring. In this manner, each network trunk line, preferably composed of a tip conductor and a ring conductor, is electrically engageable to a pair of the first contact elements disposed in opposite rows.

A second multiple contact connector component is secured to an outer surface of the housing and includes a plurality of second contact elements preferably aligned in two adjacent rows. The second contact elements are adapted for electrical engagement with the subscriber telephone line conductors in a manner such that each row of second contact elements is associated with a single circuit characteristic of the subscriber line conductors. The subscriber line conductors lead to the remainder of the subscriber owned telephone interchange equipment. In the preferred arrangement, each subscriber telephone line is composed of a tip conductor and a ring conductor which are electrically engageable to a pair of the second contact elements disposed in opposite rows.

An array of contact members is disposed within the housing enclosure with the contact members being aligned in a plurality of adjacent rows. Preferably, there are four rows of contact members with each row thereof being electrically engaged with and corresponding to a single row of contact elements in one of the connector components Furthermore, the two rows of contact members associated with the first connector component are aligned adjacent each other to provide a row of tip conductor connections and a row of ring conductor connections. The rows of contact members associated with the second connector component are likewise aligned adjacent each other to provide a row of tip conductor connections and a row of ring conductor connections.

To enable rapid and simple interconnection between any selected network trunk line and any selected subscriber telephone line, connector means are preferably provided to interconnect a contact member from the rows of contact members associated with the first connector component and a contact member corresponding to the same conductor circuit characteristic from the rows of contact members associated with the second connector component. Specifically, each connector means includes patchcord plug means which interconnects the tip and ring conductors of a network trunk line with the tip and ring conductors, respectively, of a subscriber telephone line by interconnecting the appropriate corresponding contact members. Furthermore, the patchcord plug means also preferably includes means for preventing the interconnection of a network trunk line conductor with a subscriber line conductor having a different circuit characteristic, thereby preventing the transposition of tip and ring conductors.

Finally, integral testing means are provided and include a test probe connector electrically connected to terminal post members disposed within the housing enclosure. The test probe connector is adapted for engagement with selected contact members from adjacent rows of contact members for independently testing the electrical circuit of any selected network trunk line or subscriber telephone line.

BRIEF DESCRIPTION OF THE DRAWINGS

The novel features which are believed to be characteristic of the present invention are set forth in the appended claims. The invention itself, however, together with further objects and attendant advantages thereof will become apparent and best understood by reference to the following detailed description taken in connection with the accompanying drawings, setting forth by way of illustration and example certain embodiments of the invention in the several figures in which like reference numerals identify like elements, and in which:

DETAILED DESCRIPTION OF THE PREFERRED EMBODIMENTS

Figures 1, 2, 3:
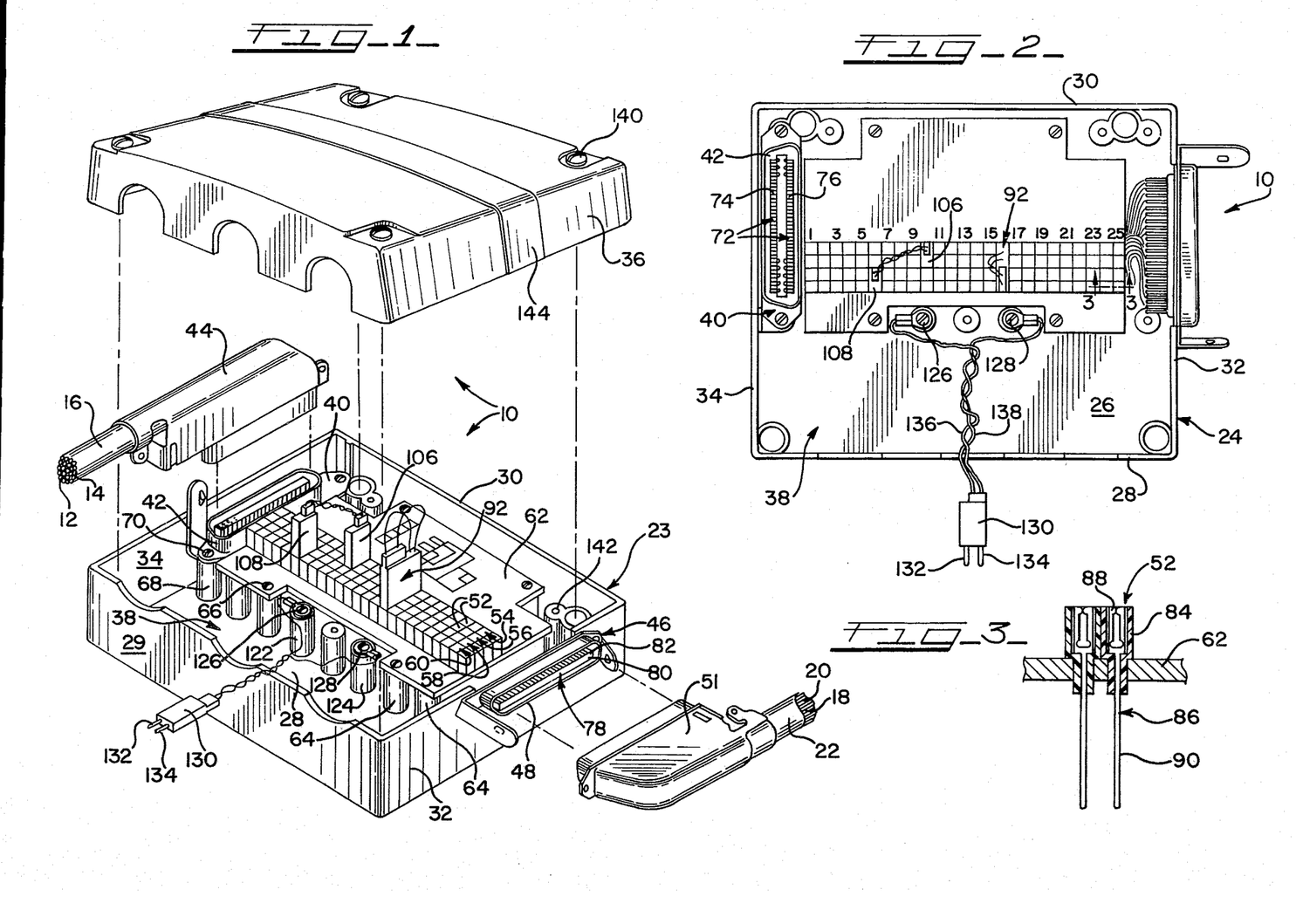
FIG. 1 is a perspective view of a modular interface device constructed in accordance with the present invention and illustrating the protective cover, a network trunk line connector and a subscriber telephone line connector in unsecured positions.
FIG. 2 is a top plan view of the modular interface device of FIG. 1 with the protective cover removed therefrom.
FIG. 3 is a cross-sectional view taken substantially along line 3—3 of FIG. 2.

Referring to FIGS. 1 and 2, a modular interface device 10 is preferably designated an orange field device to differentiate from prior color designated devices. The interface device 10 is provided for selectively interconnecting network telephone trunk lines originating from a central office telephone facility or the like to subscriber or customer telephone lines, which lines generally lead to additional telephone interchange equipment of the blue field, green field, red field and/or yellow field types and the like. Normally, each network telephone line includes a tip conductor 12 and a ring conductor 14, the standard designations "tip" and "ring" referring to positive and negative circuit characteristics. However, additional conductors capable of having different circuit characteristics for various telephone keyset functions such as bells, lights, and the like, may also be utilized with each telephone line, although such conductors generally are not introduced until a later stage in an interchange system. In preferred form, a plurality of the tip and ring conductors 12, 14 are bundled together to form a network trunk line calble 16 which is connected to the interface device 10.

In a similar manner, each subscriber telephone line includes, normally, a tip conductor 18 and a ring conductor 20, although additional conductors capable of having different circuit characteristics for various telephone keyset functions may also be included with each subscriber telephone line. Typically, however, additional keyset functions are not added to subscriber telephone lines until interconnections with yellow, blue, red and green field devices are made. A plurality of the tip conductors 18 and the ring conductors 20 are preferably bundled together to form a subscriber telephone line cable 22 which is connected to the interface device 10. In preferred form, each modular interface device 10 is designed to interconnect a cable 16 carrying twenty-five network trunk lines, each line having one tip conductor 13 and one ring conductor 14, with a single subscriber telephone cable 22 carrying twenty-five subscriber telephone lines, each such line also having one tip conductor 18 and one ring conductor 20.

The modular interface device 10 preferably includes a housing 23 which has a base member 28, four sidewalls 29, 30, 32 and 34, and a removable protective cover 36 which together define an enclosure 38. Disposed within the enclosure 38 is a first connector means 40 which preferably embodies a first multiple contact element connector component 42 in the form of a 57 Series Amphenol connector component, a trademarked product of Bunker Ramo Corporation. The first connector component 42 is adapted for mating engagement with a multiple contact element connector component 44, attached to the terminal end of the network trunk line cable 16. The component 44 is also preferably a 57 Series Amphenol connector component.

A second connector means 46 is mounted to the side 32 of the housing 23 and preferably includes a second multiple contact element connector component 48 in the form of another 57 Series Amphenol connector component. The second connector component 48 is adapted to matingly engage a multiple contact element connector component 51 which is secured to the terminal end of the subscriber line cable 22 and is also preferably a 57 Series Amphenol connector component. This arrangement whereby the network cable 16 is secured within the housing 23 and the subscriber cable 22 is secured to the exterior of the housing 23 provides rapid and positive differentiation and distinction between the network trunk lines and the subscriber telephone lines and prevents accidental mismating with the device 10.

Disposed within the enclosure 38 are a plurality of contact members 52 which are preferably aligned in a plurality of rows 54, 56, 58 and 60. The contact members 52 are mounted to a platform 62 which in turn is mounted to a plurality of support elements in the form of upstanding posts 64, which are secured to the base member 28. As illustrated, the platform 62 is preferably attached to a plurality of the posts 64 by screws 66. Furthermore, two upstanding posts 68 are also provided to which the connector component 42 is mounted with screws 70 or the like.

Figure 6:
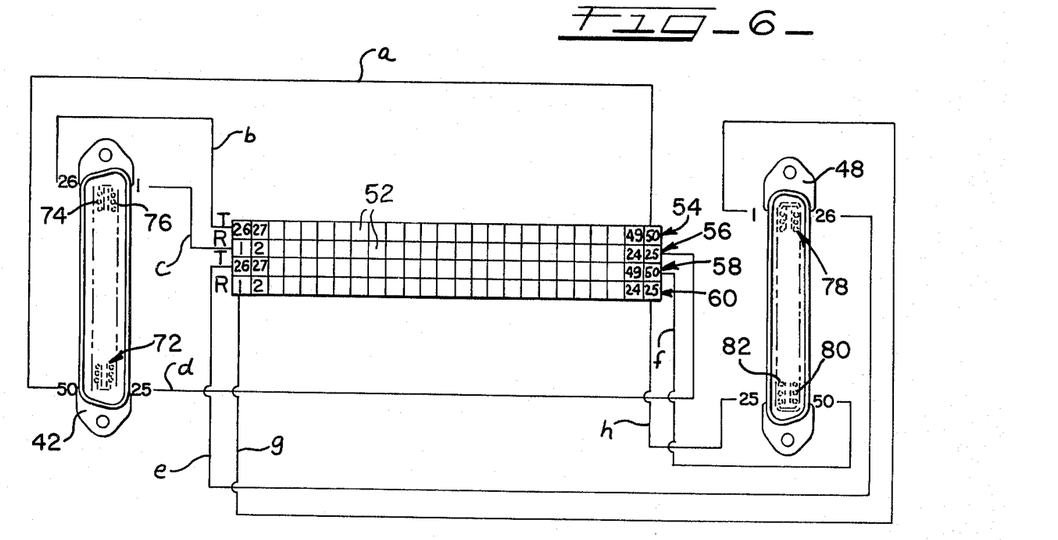
FIG. 6 is a schematic circuit diagram illustrating the circuitry connections of the modular interface device illustrated in FIGS. 1 and 2.

Referring more particularly to FIGS. 2 and 6, the first connector component 42 includes a plurality of contact elements 72 which are preferably aligned in two rows 74 and 76. Likewise, the connector component 44 secured to the terminal end of the cable 16 includes a plurality of contact elements (not illustrated) which are also preferably aligned in two rows and are adapted for mating electrical engagement with the contact elements 72. In the illustrated form, each row 74 and 76 includes twenty-five contact elements 72 thereby providing twenty-five pairs of contact elements 72 in the connector component 42. This arrangement is also utilized in the connector component 44 with each tip conductor 12 in the cable 16 being terminated to one contact element in the same row within the connector 44, and each ring conductor 14 being likewise terminated to one contact element in the second row within the connector component 44. Thus, the cable 16 carries twenty-five network telephone trunk lines each consisting of one tip conductor 12 and one ring conductor 14, and when the connector components 42 and 44 are matingly engaged, the contact elements 72 in the row 74 become electrically engaged to the tip conductors 12, while the contact elements 72 in the row 76 become electrically engaged with the ring conductors 14.

The contact elements within the connector components 48 and 51 are preferably arranged in a manner substantially identical to the contact elements within the connector components 42 and 44. In other words, the connector component 51 preferably includes twenty-five pairs of contact elements (not illustrated) aligned in two rows to terminate twenty-five pairs of subscriber telephone lines, each subscriber telephone line consisting of one tip conductor 18 and one ring conductor 20. The tip and ring conductors 18 and 20 are terminated such that the contact elements within the connector component 51 terminate all of the tip conductors 18 in one row and all of the ring conductors 20 in the second row.

The connector component 48 mounted to the housing 23 also includes twenty-five pairs of contact elements 78 aligned in two rows 80, 82 and are adapted for mating electrical engagement with the contact elements of the connector component 51. When the connector components 48 and 51 are matingly engaged, the contact elements 78 in row 80 preferably become electrically engaged to the tip conductors 18, while the contact elements 78 in the row 82 become electrically connected to the ring conductors 20. It should be emphasized that while the preferred embodiment is illustrated and described as including two rows of contact elements in each of the connector components 42, 44, 48 and 51 for terminating tip and ring conductors, the present invention is not to be limited to such an arrangement. It is envisioned that any number and arrangement of contact elements and connector components as well as additional conductors for different keyset functions may be utilized with the interface device of the subject invention.

Referring to the preferred embodiment illustrated in FIGS. 1, 2 and 6, each contact member 52 in the row 54 is electrically connected by a conductor, as illustrated at a and b, to a contact element 72 in the row 74 of the first connector component 42. Likewise, each contact member 52 in the row 56 is electrically connected by a conductor, such as c or d, to a contact element 72 located in the row 76 of the first connector component 42. In this manner, when the connector components 42 and 44 are engaged, all of the contact members 52 in the row 54 become electrically connected to a tip conductor 12, while all of the contact members 52 in the row 56 become electrically connected to a ring conductor 14. In the preferred embodiment, each pair of adjacent contact members 52, one from each row 54 and 56, are associated with one network trunk line consisting of a pair of tip and ring conductors 12, 14.

In a similar preferred manner, each contact member 52 in the row 58 is connected by a conductor, as illustrated at e and f, to a contact element 78 in the row 80 in the connector component 48. Likewise, each contact member 52 in the row 60 is connected by an electrical conductor, such as g and h, to a contact element 78 in the row 82 of the connector component 48. In this manner, when the connector components 48 and 51 are engaged together, the contact members 52 in the row 58 becomes electrically connected to the tip conductors 18, while the contact members 52 in the row 60 become electrically connected to the ring conductors 20. In the preferred embodiment, each pair of adjacent contact members 52, one from each row 58 and 60, become associated with one subscriber telephone line consisting of a pair of tip and ring conductors 18, 20.

With particular reference to FIG. 3, each contact member 52 typically includes a jack housing 84 which is firmly engaged within an aperture in the platform 62. An electrical contact 86 is disposed within the jack housing 84 and includes a bifurcated active contact portion 88 which electrically receives and engages a patch contact element as described below. A standard wire wrap terminal contact portion 90 is also provided for electrically engaging one end of a conductor a–h. Thus, open and short circuits as well as circuit grounding are avoided since the contacts 86 are not directly exposed to the environment.

Figures 4, 5, 7:
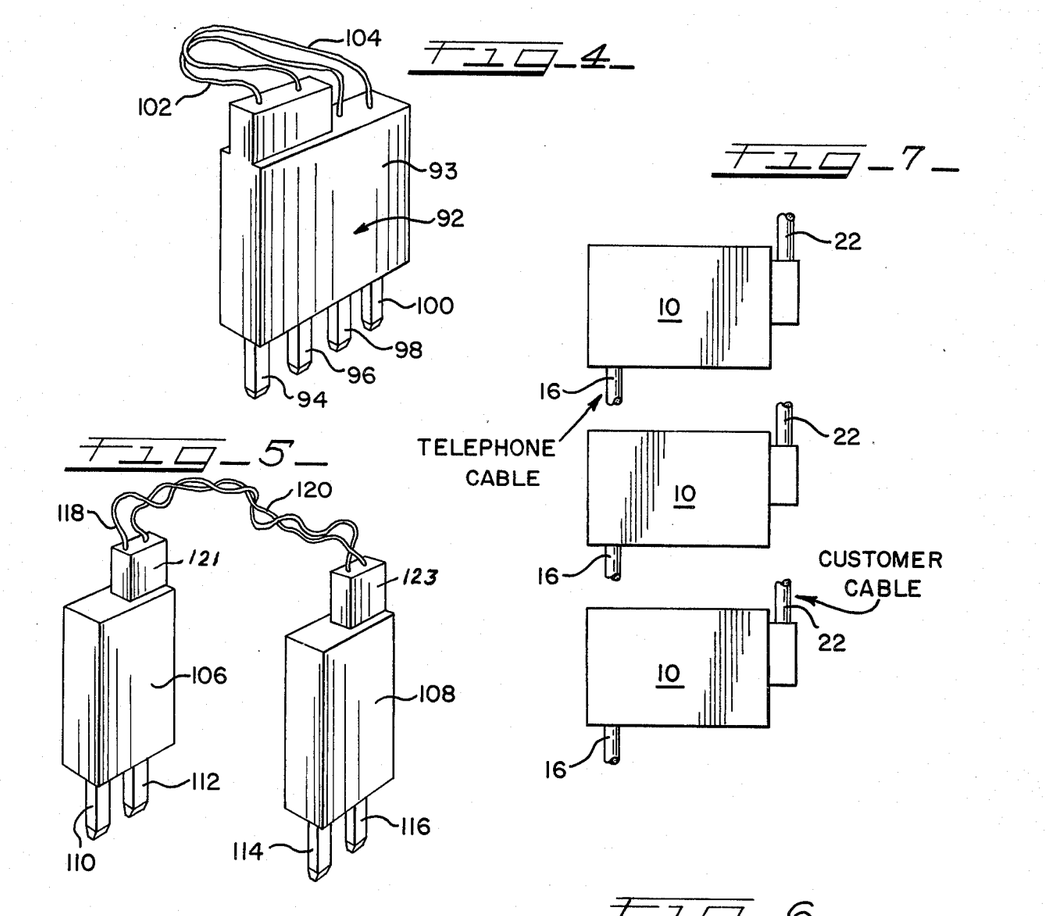
FIG. 4 is a front perspective view of one embodiment of a patchcord plug utilized in the modular interface device of the present invention.
FIG. 5 is a front perspective view of a second embodiment of a patchcord plug utilized with the modular interface device of the present invention.
FIG. 7 is a front elevation view of a series of modular interface devices constructed in accordance with the present invention as mounted to a wall at the site of a subscriber telephone interchange system.

Turning to FIGS. 1, 2 and 4, connector means are provided to electrically interconnect one contact member 52 from the row 54 with a contact member 52 from the row 58, and a contact member 52 from the row 56 with a contact member 52 in the row 60. In preferred form, each pair of adjacent contact members 52 in the rows 54 and 56 are interconnected respectively with a pair of adjacent contact members 52 in the rows 58 and 60. In this manner, the tip and ring conductors of each network trunk line are electrically interconnected with corresponding tip and ring conductors of one subscriber telephone line. Preferably, patchcord connector means are utilized and are adapted to prevent the interconnection between trunk line conductors and subscriber line conductors having different circuit characteristics so as to prevent transposition of tip and ring. In addition, the contact members 52 are preferably color coded to permit easy identification of trunk line/subscriber line interconnections.

One preferred embodiment of the patchcord connector means includes a patchcord plug 92 having a housing 93 and four aligned patch contact elements 94, 96, 98 and 100 projecting therefrom. Each of the patch contact elements 94–100 is adapted for insertion within a jack housing 84 of one contact member 52 to electrically engage the bifurcated active portion 88 of a contact 86. The four patch contact elements 94–100 are aligned in a row and spaced apart such that they engage a transverse row of four adjacent contact members 52, one from each row 54–60, when the patchcord plug 92 is engaged with the array of contact members 52.

The patchcord plug 92 illustrated in FIG. 4 also includes an integral conductor 102 which electrically interconnects the first patch contact element 94 with the third patch contact element 98, and an integral second conductor 104 which interconnects the second patch contact element 96 with the fourth patch contact element 100. Thus, when the patchcord plug 92 is engaged with the array of contact members 52, a contact member 52 in the row 54, which is electrically engaged with a tip conductor 12, always becomes electrically interengaged with a contact member 52 in the row 58, which is electrically connected to a tip conductor 18. Likewise, a contact member 52 in the row 56, which is electrically connected to a ring conductor 14, always becomes interengaged with a contact member 52 in the row 60, which is electrically connected to a ring conductor 20. Thus, inadvertent transposition of the connections or splitting of conductor pairs is virtually impossible thereby preventing the interconnection of a tip conductor 12 with a ring conductor 20 or a ring conductor 14 with a tip conductor 18. It is envisioned that when all twenty-five telephone lines are desired to be used, the initial arrangement of contact members 52 is such that twenty-five patchcord plugs 92 are engaged with the array of contact members 52 in the above-described manner.

However, it often becomes desirable or even necessary to re-arrange connections between particular network trunk lines and various subscriber telephone lines. Referring more particularly to FIG. 5, an alternate embodiment of the patchcord connector means may be utilized to achieve this re-arrangement or cross-connect capability. In this embodiment, two patchcord connectors 106 and 108 are utilized, each of which includes two patch contact elements. Specifically, the connector 106 includes the patch contact elements 110 and 112, while the connector 108 includes the patch contact elements 114 and 116. Each of the patch contact elements 110–116 is adapted for insertion within a jack housing 84 of a contact member 52 to electrically engage the bifurcated active portion 88 of a contact 86.

This particular embodiment of the patchcord connector means also includes a conductor 118 which electrically connects the patch contact element 110 with the patch contact element 114, and a conductor 120 which electrically connects the patch contact element 112 with the patch contact element 116. The conductors 118, 120 may be of sufficient length to extend the entire length of the array of contact members 52. The patchcord connector 106 is then interengaged with adjacent contact members 52 in the rows 54, 56 so as to make electrical connection with a tip and ring conductor 12 and 14 of one network trunk line. The patchcord connector 108 is similarly interengaged with adjacent contact members 52 in the rows 58 and 60 so as to electrically engage a tip and ring conductor 18, 20 of one subscriber telephone line. In this manner, as illustrated in FIG. 2, any network trunk line may be interconnected with any subscriber telephone line by interengaging the patchcord connectors 106 and 108 with the appropriate pairs of contact member 52.

To prevent transposition of tip and ring conductors, the patchcord connector 106 preferably includes a block member 121 secured to one side of the top thereof through which the conductors 118 and 120 pass, while the patchcord connector 108 likewise includes a block member 123 secured to one side of the top thereof through which the conductors 118 and 120 pass. Since each block member 121 and 123 is aligned to one side of its respective connector 106, 108, easy identification and orientation of the proper alignment of the patchcord connectors 106 and 108 is provided, thereby avoiding transposition of the connection between tip and ring conductors. Furthermore, while it is not specifically illustrated herein, inadvertent transposition of tip and ring conductors may also be readily prevented by providing appropriate key guideways within each housing 84 and keying elements on the patch contact elements 110–116. Thus, any network trunk line can be simply and easily activated or deactivated merely by engaging or disengaging, respectively, the appropriate plug 92 or the paired patchcord connectors 106 and 108. Furthermore, the contact members 52 and the pactchcord plugs 92 and connectors 106 and 108 are all compatible in the device 10 for interposition with standard industry plugs and jacks.

Rapid and simple identification and location of telephone line malfunctions is a highly desirable feature in any telephone interchange system. When the ownership and maintenance responsibility of a telephone interchange system is divided, however, between a telephone company and a private subscriber or customer, quick identification of whether the telephone company or the individual subscriber must further locate and repair a specific malfunction is very desirable and even necessary. This requires a simple means for testing the various telephone lines to determine the general location of such a malfunction, that is whether the malfunction is occurring in the network trunk lines or other equipment owned by the telephone company, or whether it is located in the subscriber owned equipment. Inasmuch as the orange field interface device 10 provides a specific junction between network trunk lines owned and operated by a telephone company with individual subscriber or customer owned telephone interconnection system lines and equipment, the present invention provides an ideal location for and in fact includes means for testing the circuits of the network trunk lines and subscriber telephone lines to locate a malfunction therein.

Turning to FIGS. 1 and 2, testing means integral with the housing 23 are provided for permitting simple testing of the electrical circuit of each network trunk line and each subscriber telephone line to determine the location of a line malfunction, that is to determine whether such a malfunction is occurring in a subscriber telephone line or in a network trunk line. The integral testing means preferably includes two upstanding terminal post members 122 and 124 secured to the base 28. Each post member 122, 124 includes an electrical contact surface preferably in the form of a metal screw 126 and 128, respectively. A test probe connector 130, substantially identical in form to the patchcord connector 106 or 108, is provided with test contact elements 132 and 134 projecting therefrom. The test contact elements 132 and 134 are adapted for insertion into adjacent contact members 52 from the rows 54 and 56 or 58 and 60 to electrically engage the contacts 86 therewithin. Each test contact element 132, 134 is electrically connected to the contact surfaces 126 and 128, respectively, by the electrical conductors 136 and 138. Thus, when the test probe 130 is so connected to a pair of adjacent contact members 52, the contact surfaces 126 and 128 become electrically engaged with a pair of tip and ring conductors 12 and 14 or 18 and 20, depending on the particular contact members 52 engaged by the test probe 130.

When a telephone line malfunction occurs, the patchcord plug 92 or the patchcord connectors 106 and 108, whichever are being utilized, are disengaged from the contact members 52 which are associated with the particular malfunctioning line. The test probe 130 is then engaged with the adjacent contact members 52 associated with either the network trunk line or the subscriber telephone line. For purposes of example only, the probe 130 is first engaged with the adjacent contact members 52 from the rows 54 and 56. Test set means (not illustrated), such as a standard portable hand telephone test unit well known in the telephone industry, is then electrically connected to the contact surfaces 126 and 128, and the circuit of the network trunk line is then tested. It can be then determined whether or not the malfunction is occurring in the network trunk line downline from the interface device 10.

The test probe 130 is then removed and electrically engaged with adjacent contact members 52 in the remaining two rows of the appropriate subscriber telephone line, in this particular example the rows 58 and 60. It can then be determined whether or not the malfunction is occurring in the circuit of the subscriber telephone line downline from the device 10. In this manner, it can be quickly and easily determined whether a malfunction is occurring in the network trunk line, in which case the responsibility for particularly locating and repairing the specific malfunction lies with the owner and operator of the network trunk line, or whether the malfunction is occurring in the subscriber telephone interchange equipment, in which case the responsibility for locating and repairing the malfunction lies with the particular subscriber. If both tests prove negative, then the malfunction is occurring in the device 10 itself. It is important to note that such testing may be performed for any of the network trunk lines or subscriber telephone lines associated with the particular interface device 10 without interfering with the normal operation of the remaining trunk and subscriber lines.

In order to provide a protective enclosure to shield the contact elements 52 from the environment, the cover 36 is provided. The cover 36 is removably secured to the housing 23 by any desired means. Preferably, the cover 36 is secured by a plurality of screws 140 which may be interengaged with a plurality of upstanding posts 142 attached to the base 28. The housing 28 also provides storage for spare patchcord plugs 92 and connectors 106 and 108. In addition, an orange strip 144 is preferably provided along the exterior of the cover 36 in order to easily distinguish the interface device 10 from other telephone interconnection equipment.

Referring to FIG. 7, a particular telephone interface system will generally require a plurality of the interface devices 10. It is envisioned that the devices 10 may be gang mounted and arranged along a wall in proximity convenient to both telephone company and subscriber telephone lines. In preferred form, the network trunk cables 16 are aligned on one side, while the subscriber connections and cables 22 are aligned on another side. In this manner, the particular telephone connections may be conveniently and easily identified so as to avoid mismating.

From the above, it can be seen that the interface device of the present invention provides simple and effective means for selectively interconnecting network telephone trunk lines with various subscriber telephone lines and interchange equipment without the need for special tools. The present invention is compact and eliminates the need for interconnecting the network telephone trunk lines with a variety of different devices within subscriber telephone interface systems. Furthermore, the present invention provides a protective enclosure and cover, easy telephone line cross-connect and connection re-arrangement capabilities, and prevents inadvertent transposition between tip and ring conductors. In addition, the orange field interface device of the present invention permits isolation of the entire interface unit from ground as well as positive identification of network trunk line and subscriber telephone line connections. Finally, the present invention enables activation and de-activation of individual telephone lines without splitting pairs of contact members or affecting the functioning of other telephone lines, and it provides means for quickly and easily testing the circuit of each subscriber telephone line and network trunk line in the case of telephone line malfunction.

It will be understood that the invention may be embodied in other specific forms without departing from the spirit or central characteristics thereof. The present examples and embodiments therefore, are to be considered in all respects as illustrative and not restrictive, and the invention is not to be limited to the details given herein but may be modified within the scope of the appended claims.

What we claim is:

1. A modular interface device comprising:
    a housing;
    first connector means mounted to said housing and engageable with a plurality of telephone network trunk lines, each said trunk line including a plurality of conductors;
    second connector means mounted to said housing and engageable with a plurality of subscriber telephone lines, each said subscriber line including a plurality of conductors;

an array of contact members disposed within said housing and aligned in a plurality of rows, the contact members of each said row being electrically connected to one of said connector means so as to electrically connect each row of contact members with the conductors engaged with said one said connector means;

means for interengaging one contact member from each said row of contact members to electrically interconnect the conductors of one said trunk line with the conductors of one said subscriber line, said interengaging means further including means for avoiding interconnection between a trunk line conductor and a subscriber line conductor when said interengaging means are improperly oriented; and means including terminal elements on said housing having contact surfaces engageable with appropriate closed circuit test set means, and a test probe electrically connected to said terminal elements and engageable with the contact members of each of said network trunk lines and each of said subscriber telephone lines to permit ready testing of the electrical circuit of each said network trunk line and each said subscriber telephone line being tested.

2. The modular interface device as described in claim 1 wherein said interengaging means comprises patchcord connector members.

3. The modular interface device as described in claim 1 wherein said means for avoiding interconnection between a trunk line conductor and a subscriber line conductor comprises conductor means integrally incorporated within said interengaging means in such a manner that said interengaging means may be connected in any manner to said array of contact members arranged so that interconnection between a trunk line conductor and a subscriber line conductor is prevented.

4. A modular interface device for selectively interconnecting a plurality of telephone network trunk line conductors with a plurality of subscriber telephone line conductors comprising:
   a housing;
   a first connector component secured to said housing and including a plurality of contact elements aligned in at least two rows, said contact elements being electrically engageable with said trunk line conductors;
   a second connector component secured to said housing and including a plurality of second contact elements aligned in at least two rows, said second contact elements being electrically engageable with said subscriber line conductors
   an array of contact members disposed within said housing and aligned in a plurality of rows, each said row to contact members being electrically engaged with and corresponding to a single row of contact elements in one of said connector components;
   patchcord connector means for selectively interconnecting contact members from each said row of contact members associated with said first connector component with contact members from the remaining rows of contact members associated with said second connector component; and
   means including terminal elements on said housing having contact surfaces engageable with appropriate closed circuit test set means, and a test probe electrically connected to said terminal elements and engageable with selected contact members of different rows of contact members to permit ready testing of the electrical circuit of each said network trunk line conductor and subscriber telephone line conductor.

5. A modular interface device for selectively interconnecting telephone network trunk line conductors terminated in a first multiple contact connector component with subscriber telephone line conductors terminated in a second multiple contact connector component, the contact elements of each said first and second multiple contact connector component being arranged in a plurality of rows, said interface device comprising:
   a housing including a base member, a plurality of sidewalls, and a cover releasably engageable with said sidewalls to define an enclosure;
   a first interface connector component secured to said housing and adapted for mating engagement with said first multiple contact connector component, the contact elements of said first interface connector component being arranged in rows corresponding to the rows of contact elements of said first multiple contact connector component;
   a second interface connector component secured to said housing and adapted for mating engagement with said second multiple contact connector component, the contact elements of said second interface connector component being arranged in rows corresponding to the rows of contact elements of said second multiple contact connector component;
   an array of contact members disposed within said enclosure and aligned in a plurality of adjacent rows equal in number to the combined number of rows of contact elements in said first and second interface connector components, each said row of contact members being electrically connected and corresponding to a single row of contact elements in one of said interface connector components, the rows of contact members electrically connected to one said interface connector component being aligned adjacent each other;
   patchcord connector means for selectively interconnecting said contact members so as to electrically connect a trunk line conductor with a selector subscriber line conductor; and
   means including terminal elements on the housing having contact surfaces engageable with appropriate closed circuit test set means, and a test probe electrically connected to said terminal elements and engageable with selected contact members in different rows to permit ready testing of the electrical circuit of each said trunk line conductor and subscriber line conductor.

6. The modular interface device as described in claim 5 wherein one said interface connector component is disposed within said enclosure and the other said interface connector component is mounted to an exterior surface of said housing.

7. The modular interface device as described in claim 6 wherein said first interface connector component is disposed within said enclosure, and said second interface connector component is mounted to the exterior surface of said housing, said housing having an aperture through which said trunk line conductors pass.

8. The modular interface device as described in claim 5 wherein said trunk line conductors are arranged in pairs with each said pair of conductors being associated with one network trunk line and including a tip conductor and a ring conductor, and wherein said subscriber line conductors are arranged in pairs with each said pair of subscriber line conductors being associated with one subscriber telephone line and including a tip conductor and a ring conductor.

9. The modular interface device as described in claim 8 wherein each said connector component includes two rows of contact elements with one said row being electrically connected to tip conductors and the second said row being electrically connected to ring conductors, and wherein said array of contact members comprises four rows of contact members with two said rows of contact members being electrically connected to tip conductors of, respectively, the network trunk lines and the subscriber telephone lines, and the other two rows of said contact members being electrically connected to ring conductors of, respectively, the network trunk lines and the subscriber telephone lines.

10. The modular interface device as described in claim 9 wherein said patchcord connector means comprises a plurality of patchcord plugs with each said patchcord plug including four aligned patch contact elements projecting therefrom and integral conductor means electrically interengaging alternate patch contact elements, each said patch contact element being engageable with one said contact member when said patchcord connector is engaged with said array of contact members, thereby electrically interconnecting the tip and ring conductors of one said truck line with, respectively, the tip and ring conductors of one said subscriber line while preventing transposition of cross connections between said tip and ring conductors.

11. The modular interface device as described in claim 9 wherein said patchcord connector means comprises a plurality of paired, electrically interconnected patchcord connectors with each said patchcord connector including two patch contact elements projecting therefrom and engageable with two adjacent contact members when said patchcord connector is engaged with said array of contact members, each said patch contact element of one patchcord connector being connected by a conductor to a patch contact element of its paired patchcord connector, thereby electrically interconecting the tip and ring conductors of one said trunk line with, respectively, the tip and ring conductors of one said subscriber line when each said pair of patchcord connectors is engaged with different rows of contact members.

12. The modular interface device as described in claim 10 wherein said means to permit ready testing comprises two terminal post members disposed within said enclosure, each said terminal post member having an exposed contact surface, and said test probe connector has two projecting contact elements for engagement with two adjacent contact members electrically connected to a tip and ring conductor, respectively, of one said line, each said projecting contact element being electrically connected by a conductor to the contact surface on one said terminal post member, whereby engagement of said contact surfaces with closed circuit test set means permits testing of the circuit of said one said line when said test probe connector engages said adjacent pair of contact members.

13. A modular interface device for selectively interconnecting a plurality of telephone network trunk lines with a plurality of subscriber telephone lines, each said line including a tip conductor and a ring conductor, the tip and ring conductors of each said network trunk line and each said subscriber line being terminated, respectively, in a trunk line and a subscriber line connector component, each said connector component having a plurality of contact elements aligned in two rows with the tip conductors being secured to said contact elements in one said row, and the ring conductors being secured to said contact elements in the second said row, said modular interface device comprising:

a housing including a base member, a plurality of sidewalls, and a cover releasably engageable with said sidewalls to define an enclosure;

a first multiple contact connector component disposed within said enclosure and adapted for mating engagement with said trunk line connector component, the contact elements of said first multiple contact connector component being arranged in two rows corresponding to and adapted for mating engagement with said rows of contact elements in said telephone trunk line connector component;

a second multiple contact connector component mounted to the exterior surface of said housing and adapted for mating engagement with said subscriber line connector component, the contact elements of said second multiple contact element connector component being arranged in two rows corresponding to and adapted for mating engagement with said two rows of contact elements in said subscriber telephone line connector component;

an array of contact members disposed within said enclosure and aligned in four adjacent rows, each said row of contact members being electrically connected and corresponding to a single row of contact elements in one said multiple contact connector component so that each said row of contact members is associated with only tip or ring conductors, the two rows of contact members electrically connected to one said multiple contact connector component being aligned adjacent each other;

patchcord connector means for selectively interconnecting one contact member from each of said four rows of contact members to electrically connect a pair of tip and ring conductors of one said trunk line with a pair of tip and ring conductors of one said subscriber ring; and means including terminal elements on said housing having contact surfaces engageable with appropriate closed circuit test set means, and a test probe connector electrically connected to said terminal elements and including two projecting contact elements for engagement with adjacent contact members electrically connected to a pair of tip and ring conductors of one said line, thereby enabling independent testing of the electrical circuit of each said network trunk line and each said subscriber telephone line.

14. The modular interface device as described in claim 13 wherein said patchcord connector means comprises a plurality of patchcord plugs with each said patchcord plug including four aligned patch contact elements projecting therefrom and integral conductor means electrically interconnecting alternate patch contact elements, each said patch contact element being engageable with one said contact member when said patchcord connector is engaged with said array of contact members, thereby electrically interconnecting the tip and ring conductors of one said trunk line with, respectively, the tip and ring conductors of one said subscriber line while preventing transposition of cross connections between said tip and ring conductors.

15. The modular interface device as described in claim 13 wherein said patchcord connector means comprises a plurality of paired, electrically interconnected patchcord connectors with each said patchcord connector including two patch contact elements projecting therefrom and engageable with two adjacent contact members when said patchcord connector is engaged with said array of contact members, each said patch contact elements of one patchcord connector being connected by a conductor to a patch contact element of its paired patchcord connector, thereby electrically interconnecting the tip and ring conductors of one said trunk line with, respectively, the tip and ring conductors of one said subscriber line when each said pair of patchcord connectors is engaged with different rows of contact members.

16. A modular interface device for selectively interconnecting a plurality of telephone network trunk lines with a plurality of subscriber telephone lines, each said line including a tip conductor and a ring conductor, said interface device comprising:

a housing;

a first connector component secured to said housing and including a plurality of contact elements aligned in at least two rows, said contact elements being electrically engageable with said trunk line conductors in a manner such that each said row of contact elements is associated with only the tip conductors or the ring conductors of said network trunk lines;

a second connector component secured to said housing and including a plurality of second contact elements aligned in at least two rows, said second contact elements being electrically engageable with said subscriber line conductors in a manner such that each said row of second contact elements is associated with only the tip conductors or the ring conductors of said network trunk lines;

an array of contact members disposed within said housing and aligned in a plurality of rows, each said row of contact members being electrically engaged with and corresponding to a single row of contact elements in one of said connector components;

connector means for selectively interconnecting contact members from each said row of contact members associated with said first connector component with contact members from the remaining rows of contact members associated with said second connector component in a manner such that trunk line tip conductors are electrically connected to subscriber line tip conductors and trunk line ring conductors are electrically connected to subscriber line ring conductors; and means including terminal elements on said housing having contact surfaces engageable with appropriate closed circuit test set means, and a test probe electrically connected to said terminal elements and engageable with selected contact members of different rows of contact members to permit ready testing of the electrical circuit of each said trunk line conductor and subscriber line conductor.

* * * * *